(12) United States Patent
Chang et al.

(10) Patent No.: US 7,992,063 B2
(45) Date of Patent: Aug. 2, 2011

(54) CONTROL CIRCUIT FOR RELEASING RESIDUAL CHARGES

(75) Inventors: Lee-hsun Chang, Hsin-Chu (TW); Yu-wen Lin, Hsin-Chu (TW); Yung-tse Cheng, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 1165 days.

(21) Appl. No.: 11/689,735

(22) Filed: Mar. 22, 2007

(65) Prior Publication Data

US 2008/0079682 A1 Apr. 3, 2008

(30) Foreign Application Priority Data

Sep. 1, 2006 (TW) .............................. 95132508 A

(51) Int. Cl.
*G01R 31/3177* (2006.01)
*G01R 31/40* (2006.01)

(52) U.S. Cl. ...................................... 714/726; 714/707

(58) Field of Classification Search .................. None
See application file for complete search history.

(56) References Cited

U.S. PATENT DOCUMENTS

| 5,043,985 A * | 8/1991 | Lin et al. ........................ 714/731 |
| 5,410,583 A | 4/1995 | Weisbrod et al. |
| 2002/0060656 A1 | 5/2002 | Okuzono |
| 2002/0149318 A1 | 10/2002 | Jeon et al. |

FOREIGN PATENT DOCUMENTS

| CN | 1116752 | | 2/1996 |
| CN | 1767070 | | 5/2006 |
| JP | 09105904 A | * | 4/1997 |
| TW | 535135 | | 6/2003 |
| TW | 200530983 | | 9/2005 |

\* cited by examiner

*Primary Examiner* — Jeffrey A Gaffin
*Assistant Examiner* — Dipakkumar Gandhi

(57) ABSTRACT

A control circuit includes a plurality of shift register stages. Each shift register stage is capable of outputting an individual output signal. The output signal is utilized to be a driving signal of next shift register stages. Each shift register stage comprises a transistor for receiving a clear signal CLR. The residual charges of the shift register stage can be released when the clear signal CLR is in a high voltage level. The clear signal CLR is enabled during a non-blanking time of a liquid crystal display (LCD). Each current register stage can use an output signal of another shift register stage which is apart from the current shift register stage by a predetermined interval as the clear signal CLR. The clear signal CLR is used to release the residual charges of the shift register stage before the shift register stage outputs its own output signal.

9 Claims, 6 Drawing Sheets

CONTROL CIRCUIT FOR RELEASING RESIDUAL CHARGES

FIELD OF THE INVENTION

The present invention relates to a control circuit of a shift register, and more particularly, to a control circuit using a clock signal to releasing the residual charges of each stage of the shift register.

BACKGROUND OF THE INVENTION

Nowadays, the consumer electronic products are generally provided with an advanced display as a basic device. A liquid crystal display (LCD) with high resolution and colorful screen has been commonly used in the consumer electronic products, such as cellular phone, digital camera, computer monitor, or laptop PC.

A shift register is an essential part of a driving circuit in the LCD panel. The shift register is used to drive a plurality of stages of displaying circuit in the LCD panel. Hence, the quality of circuit design for the shift register determines the performance of the LCD panel. Referring to FIG. 1, a circuit diagram of a stage of shift register 10 in a conventional LCD is shown. The shift register 11 includes a pull-up section 12, a pull-down section 14, a pull-down driving section 16, and a pull-up driving section 18. The pull-up section 12 uses a transistor NT11 for receiving a clock signal CK and outputting an output signal GOUT. The transistor NT11 has a gate electrically connected to a node N3, and the node N3 is electrically connected to another transistor NT18. The transistor NT18 has a gate for receiving a clear signal CLR.

Further referring to FIG. 2, a signal waveform diagram of each node in the conventional shift register 10 is shown. The transistor NT18 is opened to release the residual charges in the node N3 through the low voltage level $V_{SS}$ when the clear signal CLR in a high voltage level. However, the conventional shift register enables the clear signal CLR during a blanking time (i.e. the idle time between two frame signals inputted) for releasing the residual charges of node N3. As shown in FIG. 2, the clear signal CLR is enabled between the last stage output signal GOUT(Last) and the start signal STV enabled. Thus, the clear signal CLR is needed to be provided by an external signal from an additional power source. Furthermore, the circuit performance of last stage will be degraded if the enable time of the clear signal CLR is too close to the enable time of the last output signal GOUT(Last).

Therefore, there is a need to provide a shift register which is capable of releasing the residual charges in each stage of shift register by an internal clock signal, and the clock signal is enabled during the period of inputting a frame signal, to resolve the above-mentioned problems.

SUMMARY OF THE INVENTION

It is an object of the present invention to provide a control circuit using internal clock signals to release the residual charges of shift register stages without degrading the circuit performance of the shift registers.

To achieve the above object, the present invention provides a control circuit which comprises a plurality of shift register stages. Each shift register stage outputs an output signal, and the output signal is used as a driving signal of next shift register stage. Each shift register stage comprises a transistor for receiving a clear signal to control the on/off state of the transistor. The residual charges of corresponding shift register stage can be released through the transistor when the clear signal is in a high voltage level.

Each current shift register stage uses an output signal from another shift register stage which is apart from the current shift register stage by a predetermined interval as a clear signal of the current shift register stage, only if the clear signal does not synchronous with the output signal of the current shift register stage or the last shift register stage before the current shift register stage. The residual charges of the current shift register stage can be released in advance before the current shift register stage outputs its own output signal. Therefore, the charge coupling can be maximally diminished before the current shift register stage outputs its own output signal in order to maintain the signal quality of the current shift register stage.

In contrast to the prior art, the control circuit according to the present invention uses internal clock signals to control the on/off states of corresponding transistors in respective shift register stages for releasing the residual charges in the respective shift register stages. The internal clock signals are enabled during the period of inputting a frame signal, so the control circuit does not need to be provided with an additional external power source to control the clock signals or the clear signals. Therefore, the charge coupling of the shift register can be effectively diminished and the circuit performance and the durability of the shift register can be improved.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE PREFERRED EMBODIMENTS

Figure 1:
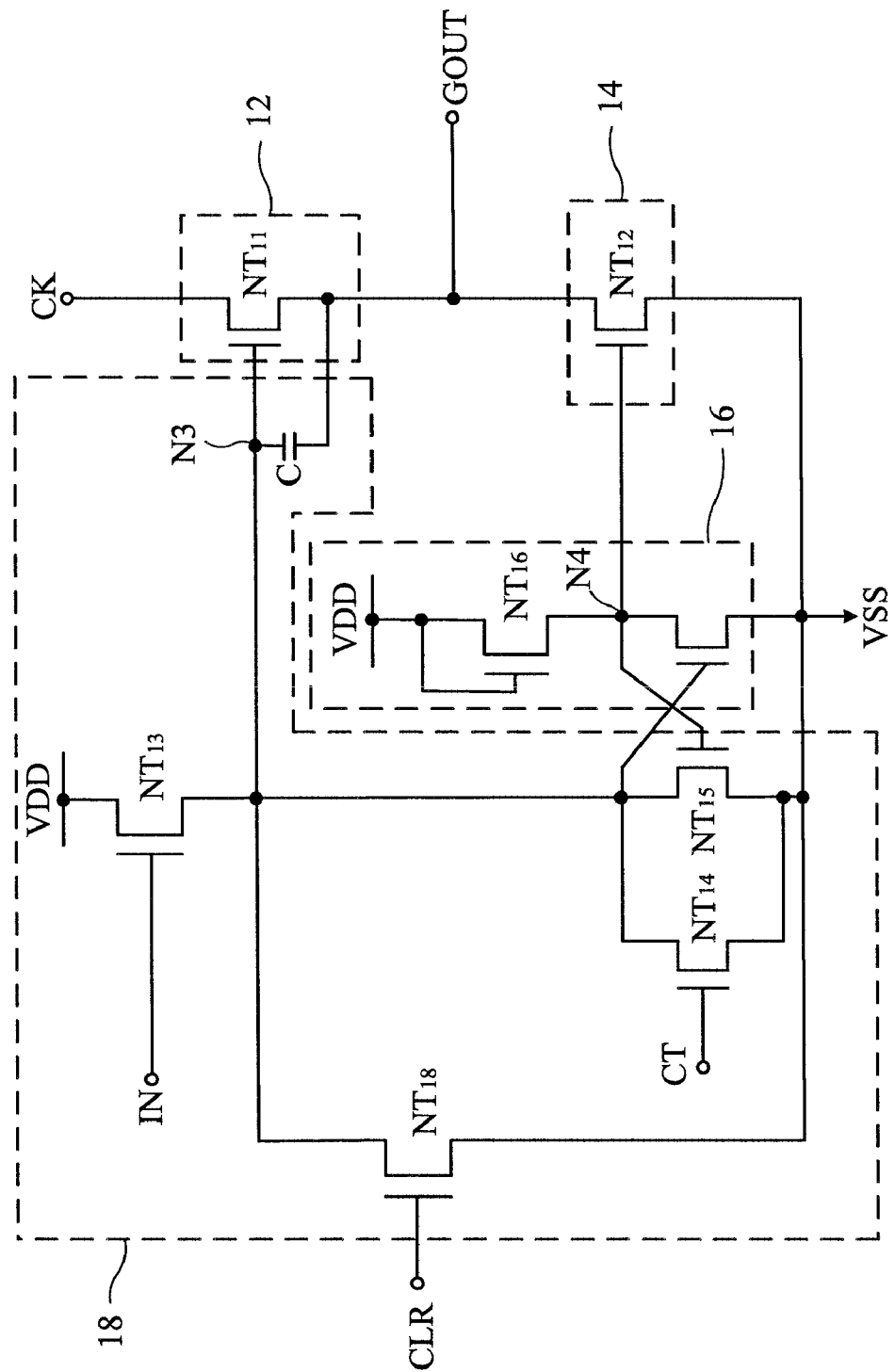
FIG. 1 is a circuit diagram of a shift register stage in a conventional LCD.
Figure 2:
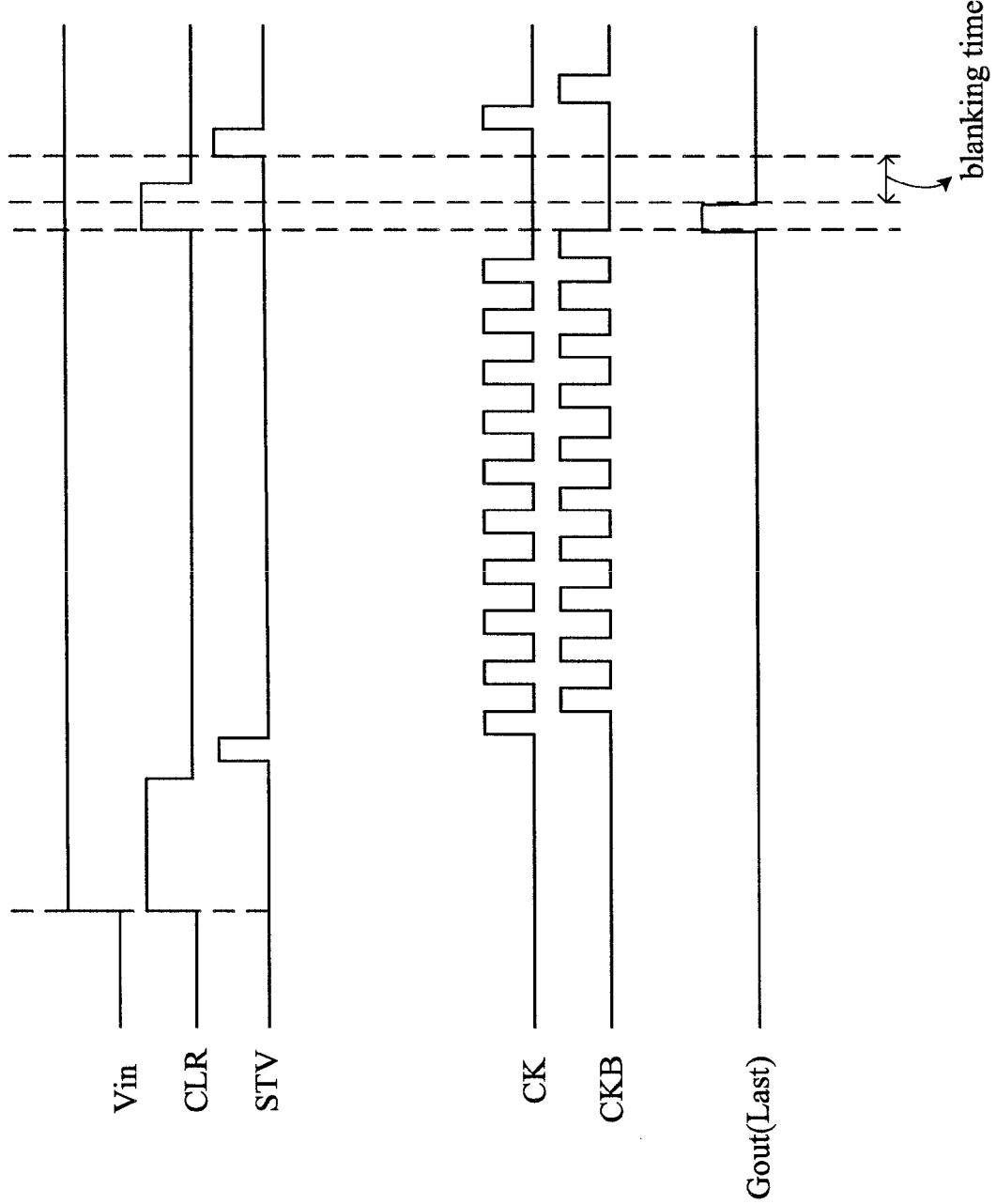
FIG. 2 is a signal waveform diagram of each node in the conventional shift register.
Figure 3:
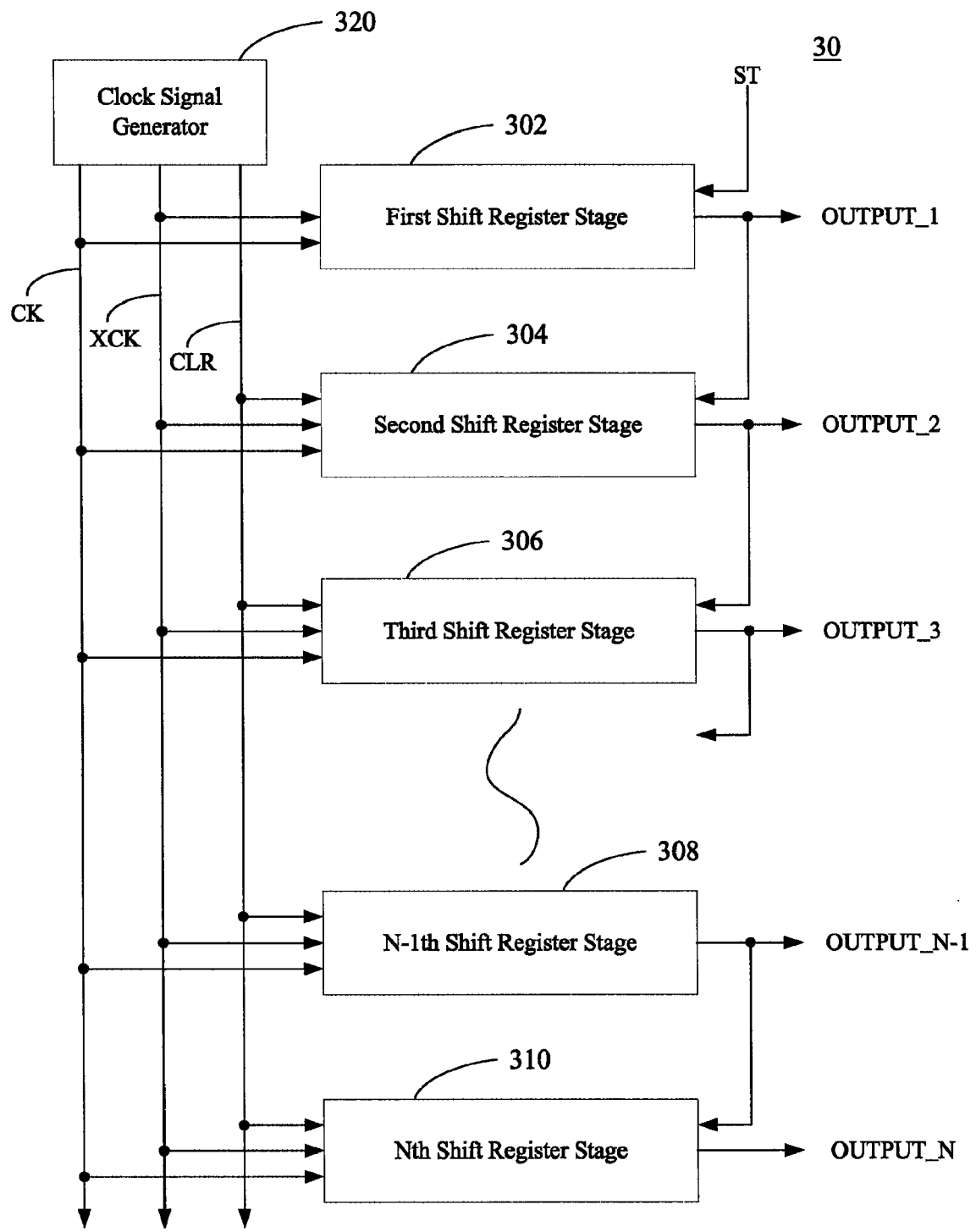
FIG. 3 is an embodiment of the control circuit in accordance with the present invention.

FIG. 3 illustrates an embodiment of the control circuit in accordance with the present invention. The control circuit 30 comprises a plurality of stages of shift register wherein the plurality of the shift register stages are connected in series. Each stage is used to output an output signal, and each output signal is used as a driving signal for next stage. For example, the first shift register stage 302 receives a start signal ST then outputs an output signal OUTPUT_1 as a driving signal for the second shift register stage 304. The second shift register stage 304 receives the output signal OUTPUT_1 from the first shift register stage 302 then outputs an output signal OUTPUT_2 as a driving signal for the third shift register stage 306. The rest stage operations may be deduced by similar analogy. Each stage receives a first clock signal CK and a second clock signal XCK both generated by a clock signal generator 320 to control the operation of each stage for outputting signals. The phase difference between the first clock signal CK and the second clock signal XCK is 180 degrees.

The clear signal CLR in the control circuit 30 is generated by the clock signal generator 320 and synchronous to the start signal ST. The residual charges in every shift register stage except the first shift register stage 302 will be released when the clear signal CLR is enabled (i.e. the clear signal CLR is in a high voltage level). Therefore, the charge coupling in corresponding output signal of each shift register can be decreased. The first shift register 302 does not receive the clear signal CLR to prevent the corresponding output signal OUTPUT_1 being influenced because the clear signal CLR is synchronous to the start signal ST in this embodiment. It should be noted that clear signal CLR may be changed to synchronous to other output signal of corresponding shift register stage, but the corresponding shift register stage will not receive the clear signal CLR for maintaining the normal operation of the output signal thereof.

Figure 4:
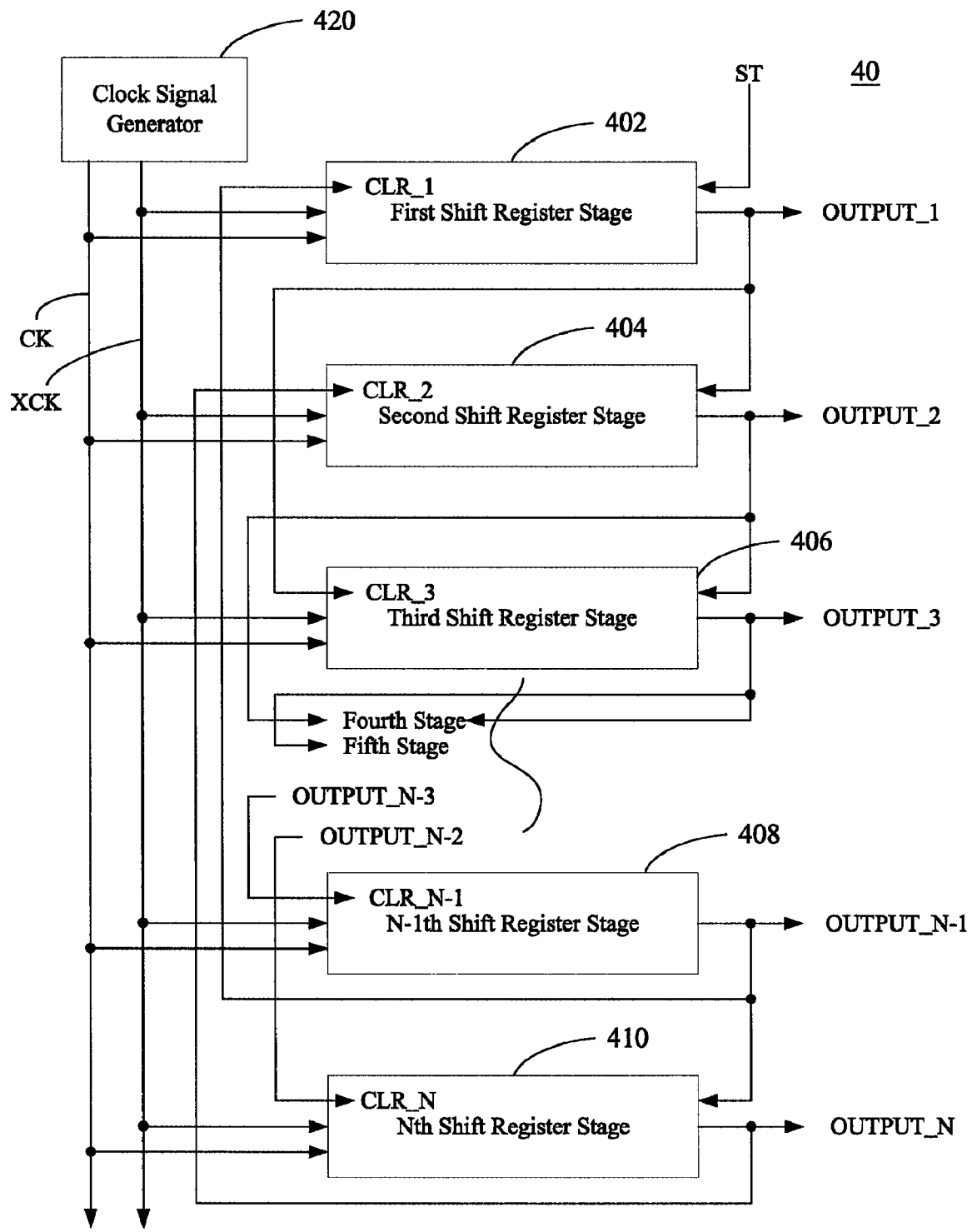
FIG. 4 is another embodiment of the control circuit in accordance with the present invention.

Referring to FIG. 4, FIG. 4 illustrates another embodiment of the control circuit in accordance with the present invention. The shift register 40 is similar to the above-mentioned shift register 30 except that each shift register stage of shift register 40 receives respective clear signal and each clear signal received by the corresponding shift register stage is an output signal of preceding two shift register stage. For example, a third shift register stage 406 receives a clear signal CLR_3 which is an output signal OUTPUT_1 of a first shift register stage 402. According to this rule, an Nth shift register stage 410 receives a clear signal CLR_N which is an output signal OUTPUT_N−2 of an N−2th shift register stage.

In FIG. 4, the residual charges of each register stage can be released according to the corresponding clear signal of each shift register stage when the corresponding clear signal is enabled. Before each shift register is going to output the corresponding output signal, the charge coupling of the last shift register is worst. The output signal of the preceding two shift register can be utilized for releasing the residual charges of the current shift register stage in advance before the current shift register stage is going to output its output signal. Therefore, the charge coupling during the current shift register stage outputs its output signal can be maximally diminished for improving the signal quality of each shift register stage. The clear signal of each shift register stage can be selected from other output signal of corresponding shift register stage which is apart from the current shift register stage by another interval, only if the clear signal does not synchronous with the output signal of the last shift register stage before the current shift register stage or the current shift register stage.

Figure 5:
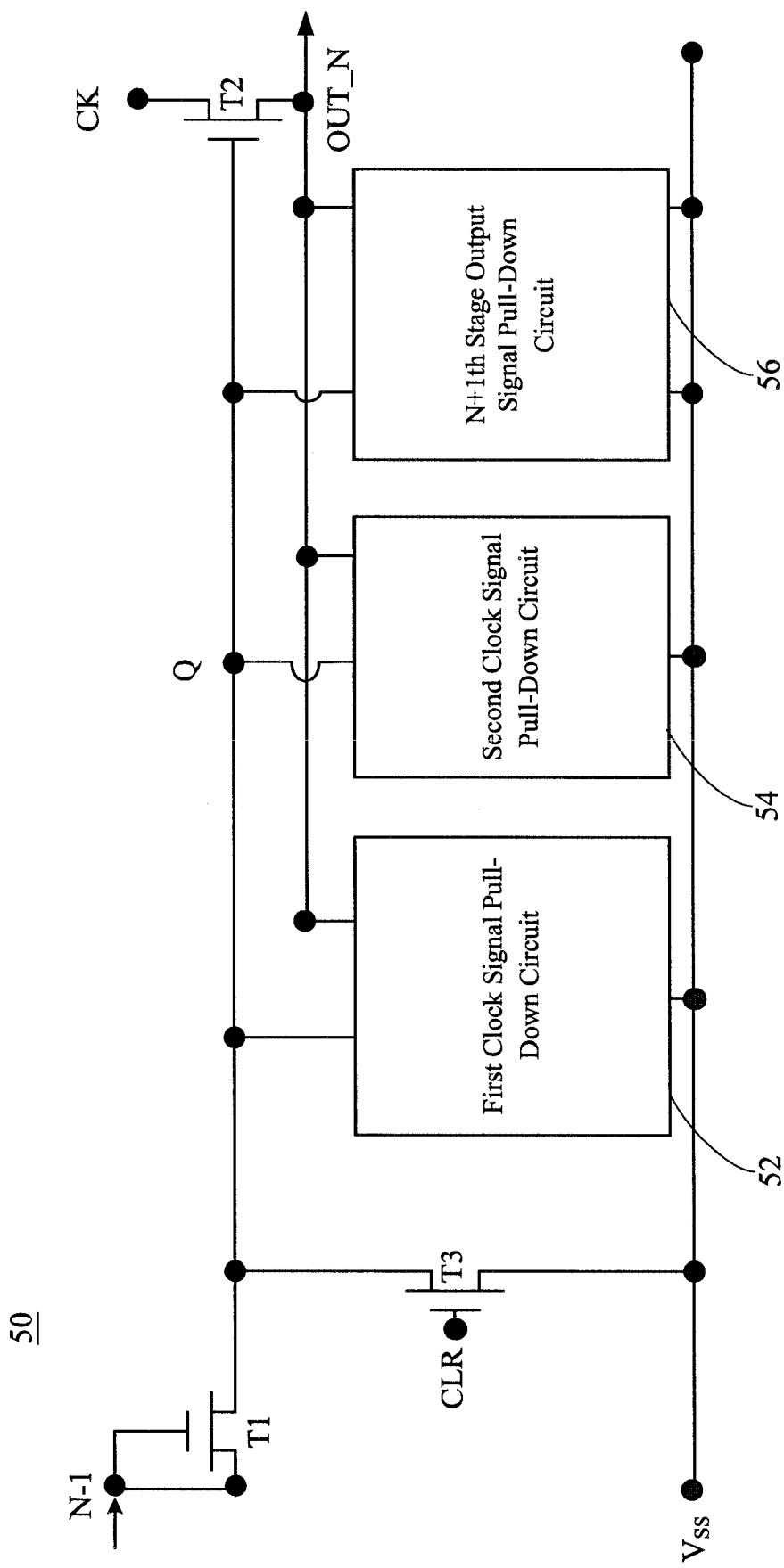
FIG. 5 is a circuit diagram of a single stage of the shift register in the control circuit according to the present invention.

FIG. 5 illustrates a circuit diagram of a single stage of the shift register in the control circuit according to the present invention. A shift register stage 50 comprises a first clock signal pull-down circuit 52, a second clock signal pull-down circuit 54, an N+1th stage output signal pull-down circuit 56, and transistors T1, T2 and T3. The transistor T1 receives a driving signal N−1 to control an on/off state of the transistor for outputting an output signal OUT_N. The transistor T3 receives a clear signal CLR. The transistor T3 is turned on to pull down the voltage level of the gate of the transistor T2 into a low voltage level $V_{SS}$ for releasing the residual charges in the transistor T2 when the clear signal CLR is in a high voltage level. Similarly, the N+1th stage output signal pull-down circuit 56 is used to pull down the voltage level of the gate of the transistor T2 into the low voltage level $V_{SS}$ for releasing the residual charges in the transistor T2 when an N+1th stage output signal is in a high voltage level. According to the present invention, each shift register stage can release the residual charges of the transistor T2 at least twice during the period of displaying a frame. Therefore, the stress of the shift register can be diminished and the circuit performance and the durability of the shift register can be improved.

As using the shift register stage 50 in the control circuit 30 shown in FIG. 3, one shift register stage having an output signal synchronized with the clear signal CLR does not receive the clear signal CLR, so the one shift register stage does not need to be provided with the transistor T3.

Figure 6:
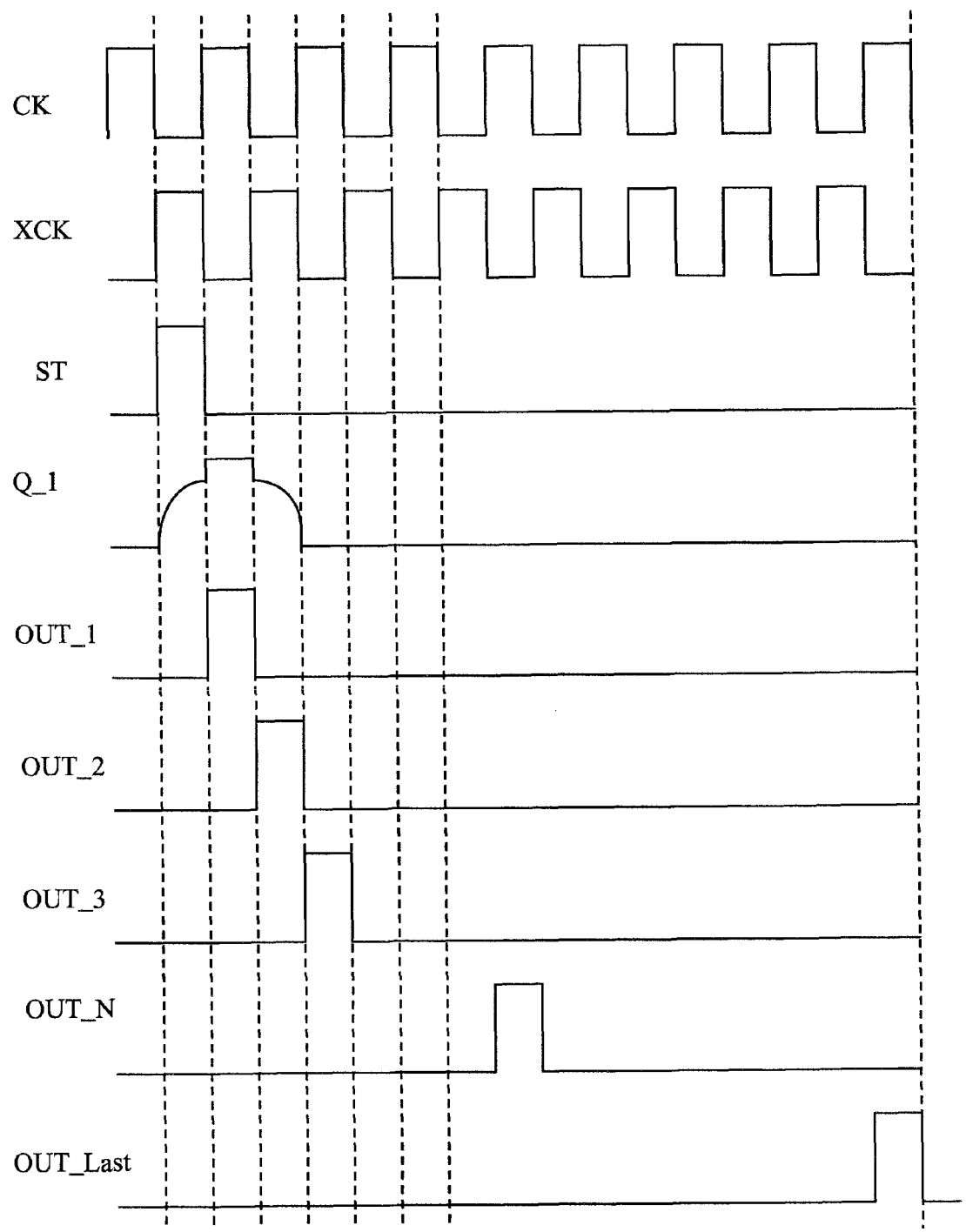
FIG. 6 is a signal waveform diagram of each node in the shift register stage according to the present invention.

FIG. 6 shows a signal waveform diagram of each node in the shift register stage 50. The clear signal CLR can be determined to synchronize with the start signal ST, the N−2th stage output signal or the N−3th stage output signal etc., in order to release the residual charges on the node Q for diminishing the charge coupling.

In contrast to the prior art, the control circuit according to the present invention uses internal clock signals to control the on/off states of corresponding transistors in respective shift register stages for releasing the residual charges in the respective shift register stages. The internal clock signals are enabled during the period of inputting a frame signal, so the control circuit does not need to be provided with an additional external power source to control the clock signals or the clear signals. Therefore, the charge coupling of the shift register can be effectively diminished and the circuit performance and the durability of the shift register can be improved.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A control circuit for use in a liquid crystal display (LCD), comprising:
   a plurality of shift register stages electrically connected to each other in series, each shift register stage receiving a first clock signal and a second clock signal and outputting an output signal respectively according to the first and the second clock signals, the output signal being used as a driving signal of a next shift register stage, each shift register stage comprising:
   a first transistor (T1) for receiving a driving signal from a preceding shift register stage;
   a second transistor (T2) for outputting the driving signal of the next shift register stage according to the first clock signal when the first transistor is turned on; and
   a third transistor (T3) for receiving a clear signal (CLR) to release the residual charges of the second transistor by connecting the second transistor to a low voltage level through the third transistor when the clear signal is in a high voltage level;
   wherein the clear signal is a driving signal outputted from another shift register stage which is apart from the shift register stage by a predetermined interval, the clear signal is used to releasing the residual charges of the second transistor during a period when the LCD inputs a frame signal, and wherein each shift register comprises an N+1th stage output signal pull-down circuit for releasing the residual charges of the second transistor by connecting the second transistor to the low voltage level through the N+1th stage output signal pull-down circuit when an N+1th stage output signal is in the high voltage level.

2. The control circuit of claim 1, wherein the another shift register stage is apart from the shift register stage by at least one stage.

3. The control circuit of claim 1, wherein the first clock signal is a CK clock signal and the second clock signal is an XCK clock signal, and a phase difference between the first clock signal CK and the second clock signal XCK is 180 degrees.

4. The control circuit of claim 1, wherein the low voltage level is a voltage $V_{ss}$.

5. A control circuit for use in a liquid crystal display (LCD), comprising:
- a plurality of shift register stages connected to each other in series, each shift register stage receiving a first clock signal and a second clock signal and outputting an output signal respectively according to the first and the second clock signals, the output signal being used as a driving signal of a next shift register stage, each shift register stage comprising:
  - a first transistor (T1), receiving a driving signal from a preceding shift register stage;
  - a second transistor (T2), outputting the driving signal of the next shift register stage according to the first clock signal when the first transistor is turned on; and
  - a third transistor (T3), receiving a clear signal (CLR) for releasing the residual charges of the second transistor by connecting the second transistor to a low voltage level through the third transistor when the clear signal is in a high voltage level;
- wherein the clear signal is synchronous with an output signal of a predetermined shift register stage, the clear signal is used to releasing the residual charges of the second transistors of each shift register stage except the predetermined shift register stage during a period when the LCD inputs a frame signal, and the predetermined shift register stage does not receive the clear signal.

6. The control circuit of claim 5, wherein the predetermined shift register stage does not need to be provided with the third transistor.

7. The control circuit of claim 5, wherein the first clock signal is a CK clock signal and the second clock signal is an XCK clock signal, and a phase difference between the first clock signal CK and the second clock signal XCK is 180 degrees.

8. The control circuit of claim 5, wherein the low voltage level is a voltage $V_{ss}$.

9. The control circuit of claim 5, wherein each shift register further comprising an N+1th stage output signal pull-down circuit for releasing the residual charges of the second transistor by connecting the second transistor to the low voltage level through the N+1th stage output signal pull-down circuit when an N+1th stage output signal is in the high voltage level.

* * * * *